United States Patent
Chiang et al.

(10) Patent No.: US 11,502,093 B2
(45) Date of Patent: Nov. 15, 2022

(54) MEMORY STRUCTURE AND METHOD OF MANUFACTURING THE SAME

(71) Applicant: Winbond Electronics Corp., Taichung (TW)

(72) Inventors: Chang-Ming Chiang, Chiayi County (TW); Hsuan-Jung Huang, Taoyuan (TW); Che-Jui Hsu, Taichung (TW); Liann-Chern Liou, Hsinchu County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/988,266

(22) Filed: Aug. 7, 2020

(65) Prior Publication Data
US 2022/0045074 A1 Feb. 10, 2022

(51) Int. Cl.
*H01L 27/11543* (2017.01)
*H01L 27/11539* (2017.01)

(52) U.S. Cl.
CPC .. *H01L 27/11543* (2013.01); *H01L 27/11539* (2013.01)

(58) Field of Classification Search
None
See application file for complete search history.

(56) References Cited

U.S. PATENT DOCUMENTS

| | | | | |
|---|---|---|---|---|
| 5,360,751 A | * | 11/1994 | Lee | H01L 29/4983 257/E29.152 |
| 5,841,161 A | * | 11/1998 | Lim | H01L 29/42328 257/315 |
| 5,882,994 A | * | 3/1999 | Araki | H01L 29/66825 438/593 |
| 6,184,554 B1 | * | 2/2001 | Chen | H01L 27/115 257/318 |
| 7,829,931 B2 | | 11/2010 | Park et al. | |
| 7,939,861 B2 | | 5/2011 | Horch | |
| 9,595,444 B2 | | 3/2017 | Yokota et al. | |
| 2006/0237754 A1 | | 10/2006 | Ishida | |
| 2010/0283099 A1 | | 11/2010 | Ajika et al. | |

FOREIGN PATENT DOCUMENTS

| | | |
|---|---|---|
| CN | 102339834 B | 12/2015 |
| TW | I424537 B | 1/2014 |
| TW | 201644005 A | 12/2016 |

* cited by examiner

*Primary Examiner* — Anthony Ho
*Assistant Examiner* — Kevin Quinto
(74) *Attorney, Agent, or Firm* — Muncy, Geissler, Olds & Lowe, P.C.

(57) ABSTRACT

A memory structure and its manufacturing method are provided. The memory structure includes a substrate, a tunnel dielectric layer on the substrate and a floating gate on the tunnel dielectric layer. The substrate has a source region and a drain region, and the source region and the drain region are formed on two opposite sides of the floating gate. The memory structure also includes an inter-gate dielectric layer on the floating gate and a control gate on the inter-gate dielectric layer. The memory structure further includes a doping region buried in the floating gate, wherein a sidewall of the doping region is exposed at a sidewall of the floating gate. Also, the doping region and the inter-gate dielectric layer are separated from each other.

9 Claims, 7 Drawing Sheets

MEMORY STRUCTURE AND METHOD OF MANUFACTURING THE SAME

BACKGROUND

Field of the Disclosure

The present disclosure relates to a memory structure and a method of manufacturing the same, and in particular, it relates to a non-volatile memory structure and a method of manufacturing the same.

Description of the Related Art

Non-volatile memory structures can be categorized into two types, according to their write mechanism: read-only memory (ROM) and flash memory. Categorization is dependent upon whether the data in the memory can be rewritten at any time. Although flash memory does not offer arbitrary random-access rewrite or erase operations, it offers random-access read and programming operations. Also, flash memory costs much less than read-only memory and had become the dominant memory type wherever a system required a significant amount of non-volatile solid-state storage.

In general, a flash memory contains two gates. One gate is a floating gate for storing data, and the other gate is a control gate for input and output of data. The floating gate is positioned under the control gate and is in a "floating" state. The so-called "floating" means that this gate is surrounded and isolated with an insulating material to prevent loss of charge. The control gate is electrically connected to the word line to control the device. One of the advantages of flash memory is that one or more selected blocks or sections can be entirely erased. Flash memory is widely used in enterprise servers, storage and networking technologies, and a variety of consumer electronics, such as universal serial bus (USB) flash drives, mobile phones, digital cameras, tablets, personal computer memory cards for laptops and embedded controllers.

Although existing non-volatile memory structures and methods of manufacturing the same have generally been adequate for their intended purposes, they have not been entirely satisfactory in all respects. There are still some problems to be overcome in regards to the memory structures and its manufacturing methods.

SUMMARY

In some embodiments of the disclosure, a memory structure is provided. The memory structure includes a substrate and a tunnel dielectric layer on the substrate, wherein the substrate has a source region and a drain region. In some embodiments, the memory structure also includes a floating gate on the tunnel dielectric layer, wherein the source region and the drain region are formed on two opposite sides of the floating gate. In some embodiments, the memory structure also includes an inter-gate dielectric layer on the floating gate and a control gate on the inter-gate dielectric layer. In some embodiments, the memory structure further includes a doping region buried in the floating gate, and a sidewall of the doping region is exposed at a sidewall of the floating gate, wherein the doping region and the inter-gate dielectric layer are separated from each other.

In some embodiments of the disclosure, a method of manufacturing a memory structure is provided. In some embodiments, the method includes providing a substrate and forming a tunnel dielectric layer on the substrate, wherein the substrate has a source region and a drain region. In some embodiments, the method also includes forming a floating gate on the tunnel dielectric layer, wherein the source region and the drain region are formed on two opposite sides of the floating gate. In some embodiments, the method also includes forming an inter-gate dielectric layer on the floating gate and forming a control gate on the inter-gate dielectric layer. In some embodiments, the method further includes forming a doping region in the floating gate. According to the embodiment of the memory structure, a sidewall of the doping region is exposed at a sidewall of the floating gate, and the doping region is separated from the inter-gate dielectric layer.

BRIEF DESCRIPTION OF THE DRAWINGS

The present disclosure can be further understood by reading the subsequent detailed description and examples with references made to the accompanying drawings, wherein.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn at different scales for the sake of simplicity and clarity. Some embodiments are described below. Throughout the various views and illustrative embodiments, similar reference numbers are used to designate similar features/components.

Figure 1A:
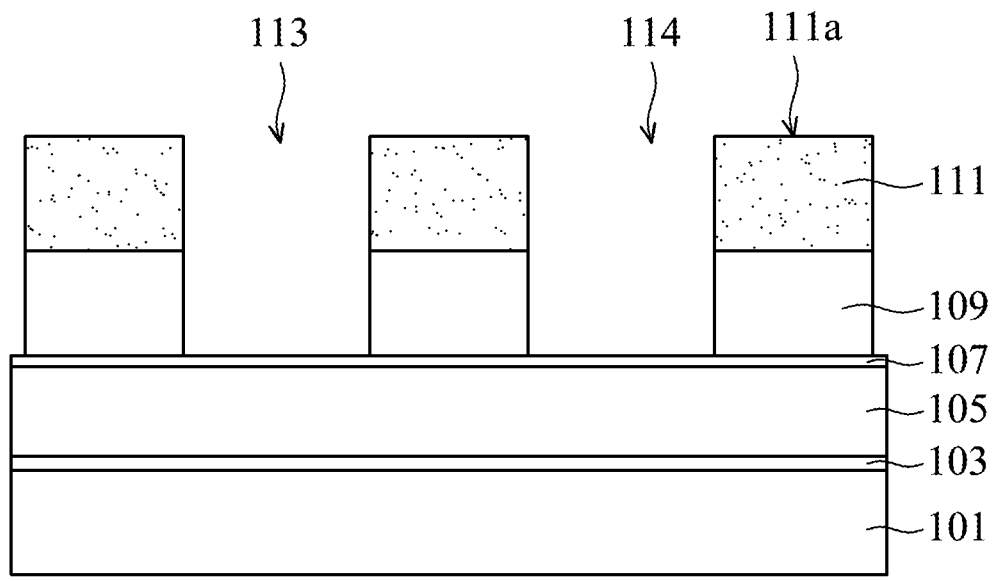
FIG. 1A-FIG. 1F are cross-sectional views of various stages of manufacturing a memory structure in accordance with some embodiments of the present invention.

FIG. 1A-FIG. 1F are cross-sectional views of various stages of manufacturing a memory structure in accordance with some embodiments of the present invention. Referring to FIG. 1A, a substrate 101 is provided. In some embodiments, the substrate 101 may include silicon, gallium arsenide, gallium nitride, germanium silicide, a semiconductor-on-insulator (SOI), another suitable substrate material, or a combination thereof. Also, the substrate 101 of the memory structure includes a source region and a drain region (not shown in FIG. 1A-FIG. 1F).

In one embodiment, a tunnel dielectric material layer 103, a floating gate material layer 105 and an inter-gate dielectric material layer 107 are sequentially formed on the substrate 101. The tunnel dielectric material layer 103 may be an oxide layer. The floating gate material layer 105 may include polysilicon, and can be formed by deposition. Also, the floating gate material layer 105 may be selectively doped with dopants. For example, n-type dopants, such as phosphorous, can be implanted into the floating gate material layer 105 such that the floating gate material layer 105 has an n-type conductivity. In addition, the floating gate material layer 105 may be a single layer structure or a multilayer structure. In one embodiment, the inter-gate dielectric material layer 107 may include several layers of dielectric materials, and can be formed as a multilayer structure. For example, the inter-gate dielectric material layer 107 may be an oxide-nitride-oxide (ONO) structure.

Referring to FIG. 1A, a control gate 109 and a mask layer 111 are formed above the inter-gate dielectric material layer 107. The control gate 109 may include polysilicon. A material layer containing polysilicon can be deposited on the inter-gate dielectric material layer 107 by any suitable deposition process, and then etched to form stacks each containing a control gate 109 and a mask layer 111. Also, the mask layer 111 may include one or more oxides, such as tetraethyl orthosilicate (TEOS). In one embodiment, the etching process stops on the inter-gate dielectric material layer 107. Also, the control gate 109 may be selectively doped with dopants. In addition, the control gate 109 may be a single layer structure or a multilayer structure. As shown in FIG. 1A, the trenches 113 and 114 are formed between two stacks, and each stack contains a control gate 109 and a mask layer 111 on the control gate 109, In one embodiment, positions of the trenches 113 and 114 are corresponding to the source region and the drain region of the memory structure, respectively.

Figure 1B:
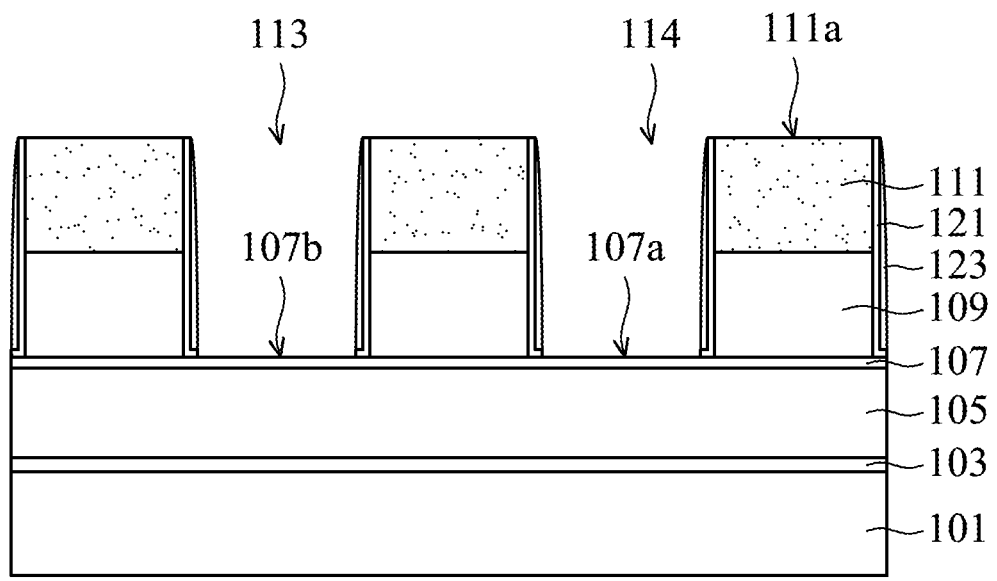

Referring to FIG. 1B, an insulating layer 121 and spacers 123 are formed to cover sidewalls of the mask layer 111, sidewalls of the control gate 109 and parts of the inter-gate dielectric material layer 107. In one embodiment, an insulating material layer and a spacer material layer can be sequentially deposited to cover the stacks of the control gates 109 and the mask layers 111. Afterward, an etching process is performed to remove the portions of the insulating material layer and the spacer material layer on the top surfaces of the mask layers 111, and also remove another portions of the insulating material layer and the spacer material layer on the inter-gate dielectric material layer 107, thereby forming the insulating layer 121 and the spacers 123. As shown in FIG. 1B, after the insulating layer 121 and the spacers 123 are formed, the trenches 113 and 114 expose the portions 107b and 107b of the top surface of the inter-gate dielectric material layer 107, respectively. In one embodiment, the insulating material layer includes an oxide, such as silicon oxide, and the insulating material is about 5 nm to about 10 nm thick. In one embodiment, the spacer material layer includes a nitride, such as silicon nitride, and the spacer material layer is about 10 nm to about 30 nm thick.

Figure 1C:
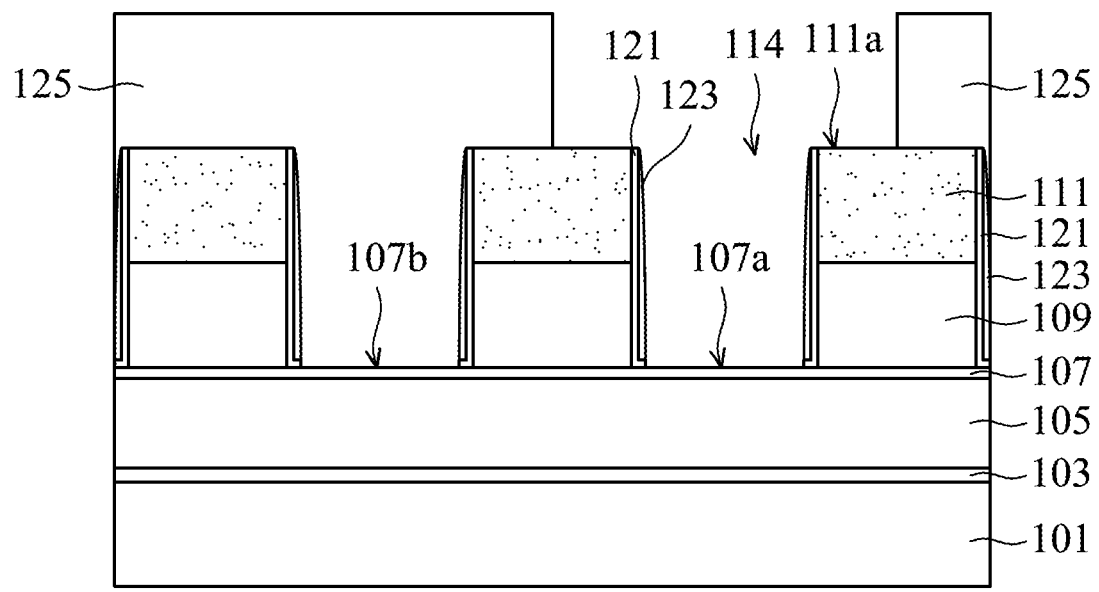

Referring to FIG. 1C, a patterned photoresist 125 is then formed on the stacks of the control gates 109 and the mask layers 111. In one embodiment, the patterned photoresist 125 covers parts of the top surface 111a of the mask layers 111, as shown in FIG. 1C. According to one embodiment of the memory structure, the patterned photoresist 125 does not fill the trench 114, and the portion 107a of the top surface of the inter-gate dielectric material layer 107 exposed by the patterned photoresist 125 is corresponding to a drain region (not shown in FIG. 1C) of the memory structure. Also, the patterned photoresist 125 fills into the trench 113 and covers the portion 107b of the top surface of the inter-gate dielectric material layer 107, wherein the portion 107b is corresponding to a source region (not shown in FIG. 1C) of the memory structure.

Figure 1D:
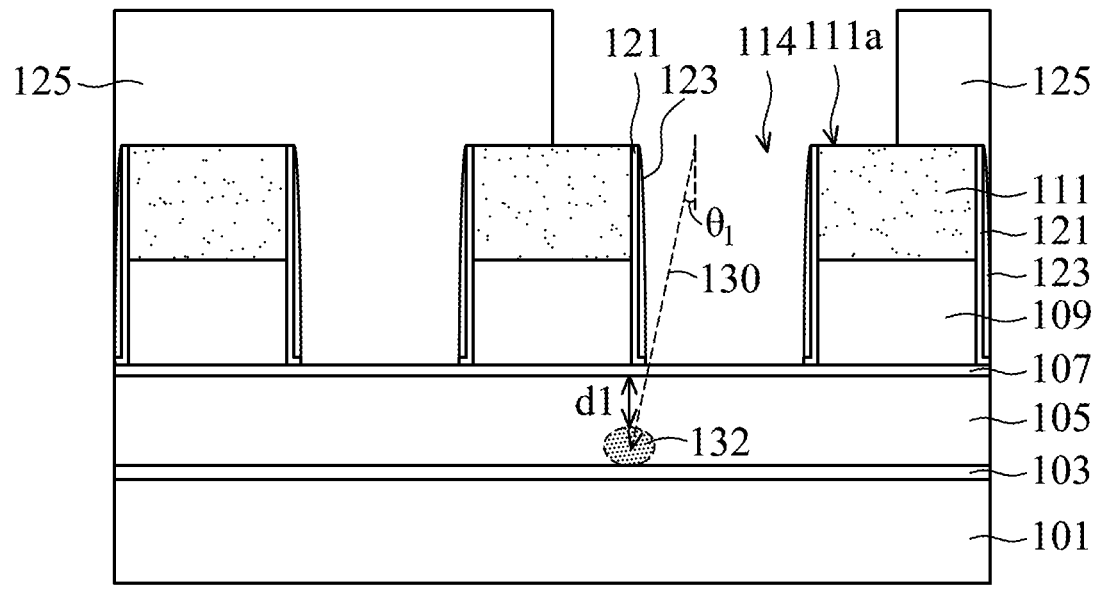

Referring to FIG. 1D, an ion implantation process 130 is performed on the lower portion of the floating gate material layer 105 at an angle θ1 on one side of the spacers 123 to form a doping region 132. In this example, the dopants implanted into the doping region 132 and the dopants implanted into the floating gate material layer 105 have opposite conductivity types. In one embodiment, the floating gate material layer 105 has an n-type conductivity by implanting with n-type dopants, and the doping region 132 has an p-type conductivity by implanting with p-type dopants (such as boron). Also, in one embodiment, the doping concentration of the doping region 132 is greater than the doping concentration of the floating gate material layer 105.

It is noted that the arrangement of the insulating layer 121 and the spacers 123 not only protect the control gate 109 on the inter-gate dielectric material layer 107 during the ion implantation process 130, but also prevent the dopants are implanted into an upper portion of the floating gate material layer 105 by controlling the thickness of the spacers 123. In other words, the doping region 132 can be formed only in the lower portion of the floating gate material layer 105 by forming the spacers 123 with an adequate thickness.

Figure 1E:
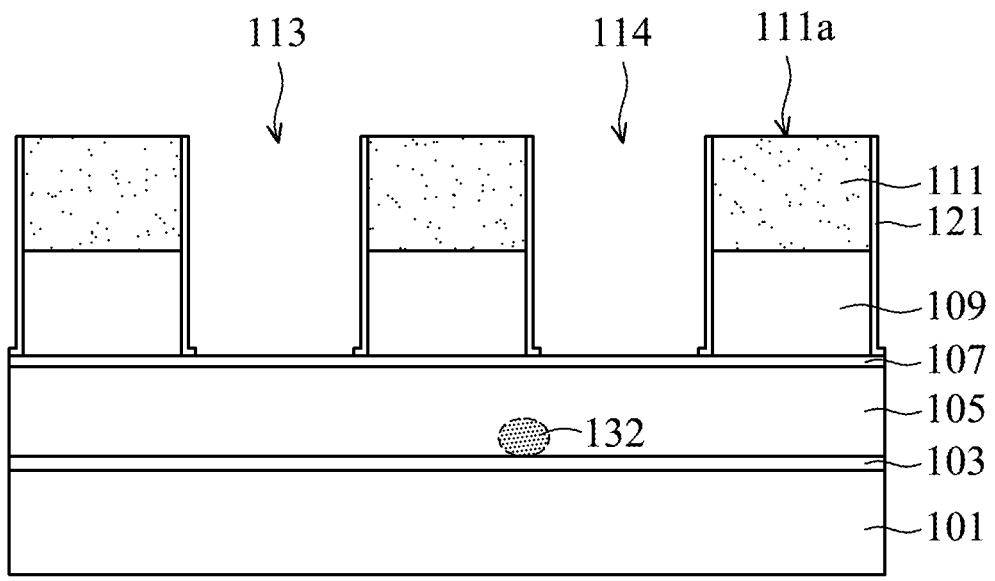

Referring to FIG. 1E, the patterned photoresist 125 is removed. Then, the spacers 123 can be optionally removed. After the spacers 123 is removed, the remaining portions of the insulating layer 121 covers the sidewalls of the control gates 109 and the sidewalls of the mask layers 111. It should be noted that the present invention is not limited in this embodiment, which illustrates the removal of the spacers 123 in the method of manufacturing the memory structure. In the present disclosure, the spacers 123 may not be removed. In some other embodiments, an etching step as illustrated in FIG. 1F can be performed directly after the patterned photoresist 125 is removed.

Figure 1F:
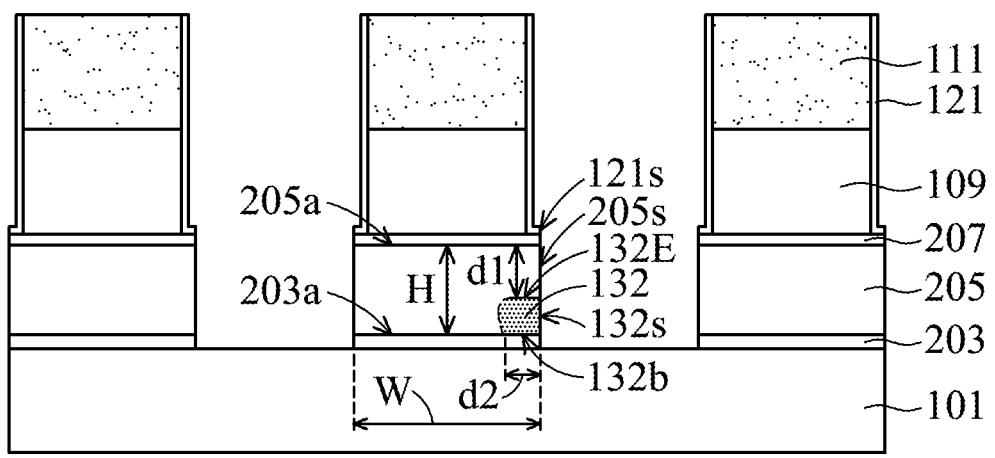

Referring to FIG. 1F, an etching process such as a dry etching process is performed. The inter-gate dielectric material layer 107, the floating gate material layer 105, and the tunnel dielectric material layer 103 are etched by an etching mask formed of the mask layer 111 and the insulating layer 121, thereby forming an inter-gate dielectric layer 207, a floating gate layer 205 and a tunnel dielectric layer 203, respectively. In one embodiment, this etching process is a self-aligned etching process. In one embodiment, this etching process is a reactive ion etching process. In this exemplification, the sidewalls of the inter-gate dielectric layer 207, the sidewalls 205s of the floating gate layer 205 and the sidewalls of the tunnel dielectric layer 203 are substantially aligned after the etching process is performed. Also, the sidewalls of the inter-gate dielectric layer 207 are aligned with the sidewalls 121s of the insulating layer 121. Accordingly, the width W of the floating gate layer 205 is greater than the width of the control gate 109. However, the present disclosure is not limited to this disclosed embodiment.

It is particularly mentioned that the doping region 132 is buried in the lower portion of the floating gate 205, and the sidewall 132s of the doping region 132 is exposed at the sidewall 205s of the floating gate 205. Since the doping region 132 and the inter-gate dielectric layer 207 are separated from each other, the capacitance between the floating gate 205 and the control gate 109 would not be reduced. In one embodiment, the top edge 132E of the doping region 132 is separated from the top surface 205a of the floating gate 205 by the distance d1. In one embodiment, the ratio of the distance d1 to the thickness H of the floating gate 205 is in a range of ½ to ⅔.

In addition, as shown in FIG. 1F, the bottom surface 132b of the doping region 132 contacts the top surface 203a of the tunnel dielectric layer 203. In one embodiment, the doping region 132 extends a distance, such as the distance d2 labelled in FIG. 1F, from the sidewall 205s of the floating gate 205 toward the inside of the floating gate 205. In one embodiment, the ratio of the distance d2 to the width W of the floating gate 205 is in a range of about ⅕ to about ¼.

According to the aforementioned embodiment, the doping region 132 containing the dopants of the first conductivity type is separated from the inter-gate dielectric layer 207. That is, there is still a portion of the floating gate 205 (having a different conductivity type than the doping region 132) above the doping region 132 and between the doping region 132 and the inter-gate dielectric layer 207. However, the present disclosure is not limited to this arrangement. In some other embodiments, another doping region 134 can be further formed on the doping region 132, wherein the conductivity type of the doping region 134 is different from the conductivity type of the doping region 132.

Figure 2A:
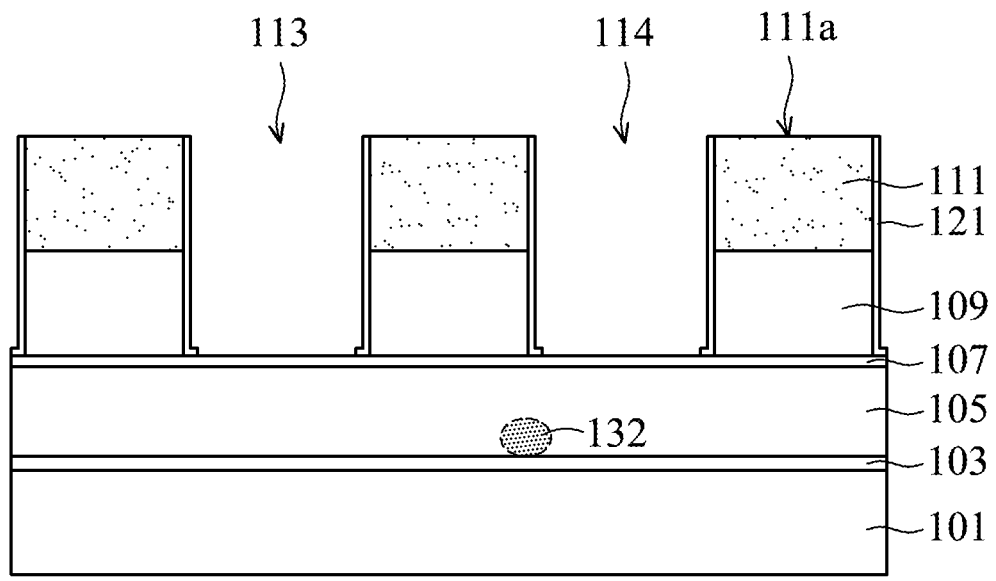
FIG. 2A-FIG. 2C are cross-sectional views of various stages of manufacturing a memory structure in accordance with some embodiments of the present invention, which show another manufacturing process following the step of FIG. 1D.
Figure 2B:
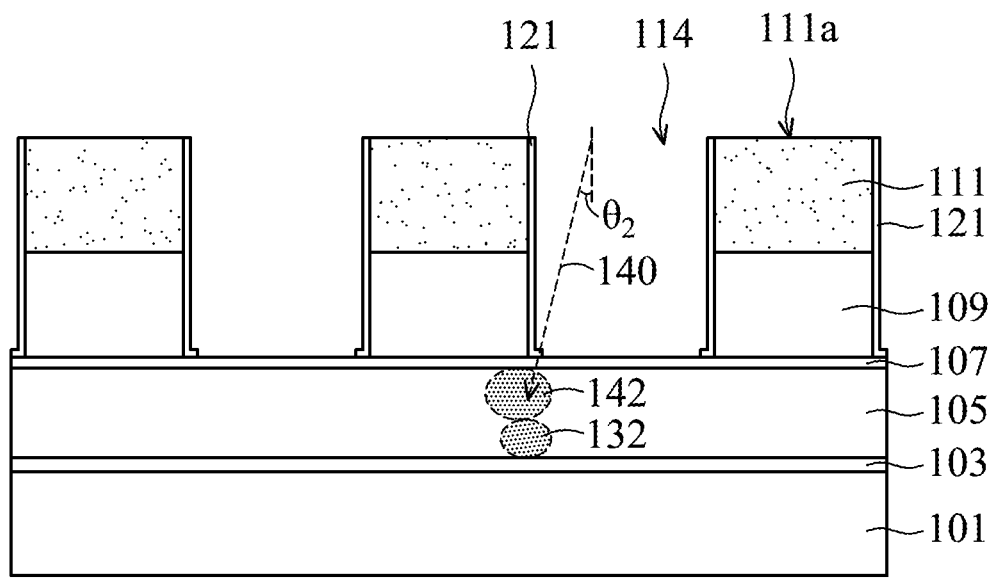
Figure 2C:
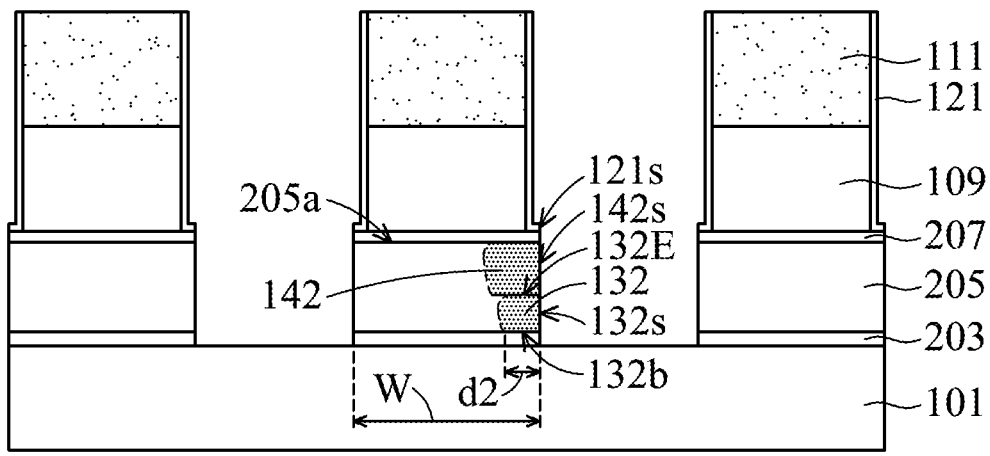

FIG. 2A-FIG. 2C are cross-sectional views of various stages of manufacturing a memory structure in accordance with some embodiments of the present invention, which show another manufacturing process following the step of FIG. 1D. Also, the materials and forming method of the features/components in FIG. 2A are identical to those in FIG. 1A-FIG. 1E and have been described above. For the sake of simplicity and clarity, those identical contents are not repeated herein.

Referring to FIG. 2B, in one embodiment, an ion implantation process 140 is performed on the upper portion of the floating gate material layer 105 at an angle θ2 on one side of the spacers 123, thereby forming another doping region 142 above the doping region 132. In this exemplified embodiment, the conductivity type of the dopants implanted into the doping region 142 is the same as the conductivity type of the dopants implanted into the floating gate material layer 105, but it is the opposite of the conductivity type of the dopants implanted into the doping region 132. In one embodiment, the doping region 142 has an n-type conductivity by implanting with n-type dopants. For example, dopants such as phosphorous are implanted into the doping region 142.

Referring to FIG. 2C, an etching process such as a dry etching process is performed. The mask layer 111 and the insulating layer 121 as formed above the inter-gate dielectric material layer 107 act as an etching mask in the etching process. The inter-gate dielectric material layer 107, the floating gate material layer 105 and the tunnel dielectric material layer 103 are etched by this etching mask to form an inter-gate dielectric layer 207, a floating gate layer 205 and a tunnel dielectric layer 203 respectively.

As shown in FIG. 2C, the doping region 132 is formed in the lower portion of the floating gate 205, and the doping region 142 is formed in the upper portion of the floating gate 205. Also, the sidewall 132s of the doping region 132 and the sidewall 142s of the doping region 142 are exposed at the sidewall of the floating gate 205. The doping region 142 may contact or not contact the doping region 132 that is under the doping region 142. In addition, the doping region 142 can be in direct contact with the inter-gate dielectric layer 207 above, or can be separated from the inter-gate dielectric layer 207 above. As shown in FIG. 2C, the top surface of the doping region 142 is in direct contact with the inter-gate dielectric layer 207.

It is particularly mentioned that the formation of the doping region 142 prevents the doping region 132 from diffusing in the subsequent high-temperature process and approaching or even contacting the inter-gate dielectric layer 207. In addition, the capacitance between the floating gate 205 and the control gate 109 would not be affected since the dopants contained in the doping region 142 and the inter-gate dielectric layer 207 have the same conductivity type. Also, in one embodiment, the doping concentration of the doping region 142 is greater than the doping concentration of the floating gate 205 so that a total capacitance between the floating gate 205 and the control gate 109 can be increased, and the writing and erasing speeds of the memory structure can be improved.

According to the embodiments above, a single-sided ion implantation process is performed on the floating gate material layer 105 through the trench 114 for forming a doping region in the floating gate 205, wherein the doping region is positioned adjacent to the drain region. However, in some other embodiments, such as the embodiment of a structure having a common drain region, two ion implantation processes can be simultaneously performed on opposite sides of two adjacent memory structures through the trench 114. Therefore, the doping regions in the floating gates 205 of the two adjacent memory structures can be formed simultaneously, and the doping regions are positioned adjacent to the common drain region.

Figure 3:
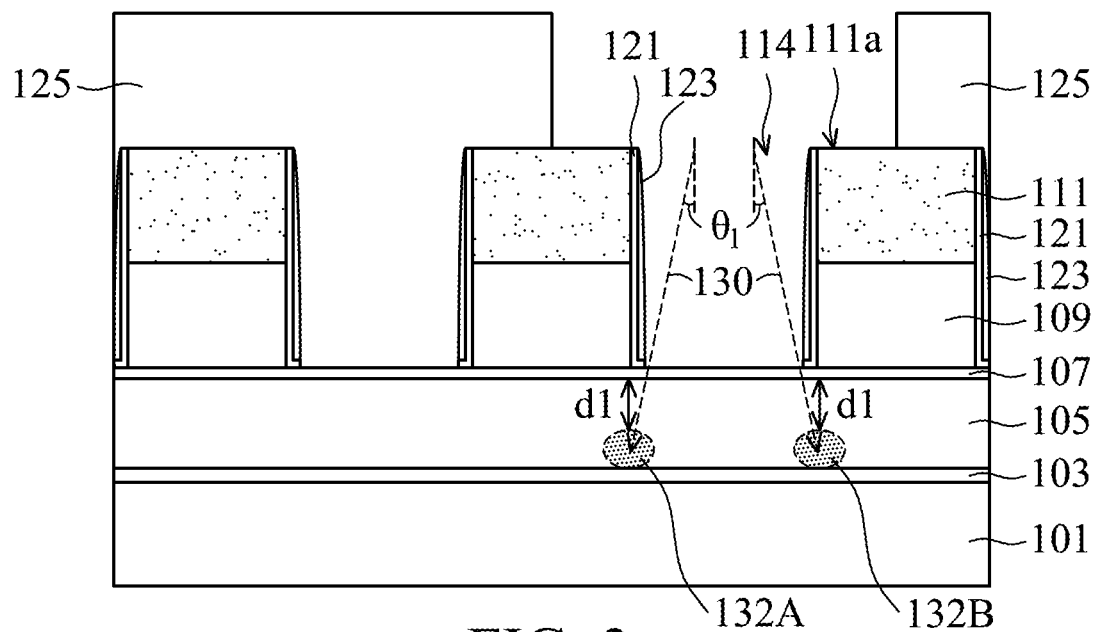
FIG. 3 is a cross-sectional view of a memory structure in a manufacturing stage in accordance with some embodiments of the present invention.

FIG. 3 is a cross-sectional view of a memory structure in a manufacturing stage in accordance with some embodiments of the present invention. The structure of FIG. 3 is similar to the structure of FIG. 1D. According to the embodiment shown in FIG. 3, two ion implantation processes are simultaneously performed on the lower portions of the floating gate material layer 105 through the trench 114. The implantation processes are performed at an angle θ1 on each side of the spacers 123, thereby forming the doping regions 132A and 132B. In some applications, the trench 114 is corresponding to a common drain region of two adjacent memory structures. In one embodiment, the dopants implanted into the doping region 132A and the dopants implanted into the floating gate material layer 132B have opposite conductivity types. The materials and forming method of the features/components in FIG. 3 identical to those in FIG. 1A-FIG. 1F have been described above and are not redundantly repeated herein for the sake of simplicity and clarity. In addition, similar to the structure exemplified in FIG. 2B, other doping regions, which contain dopants having a different conductivity type than the dopants in the doping regions 132A and 132B, can also be formed on respective doping regions 132A and 132B.

Figure 4A:
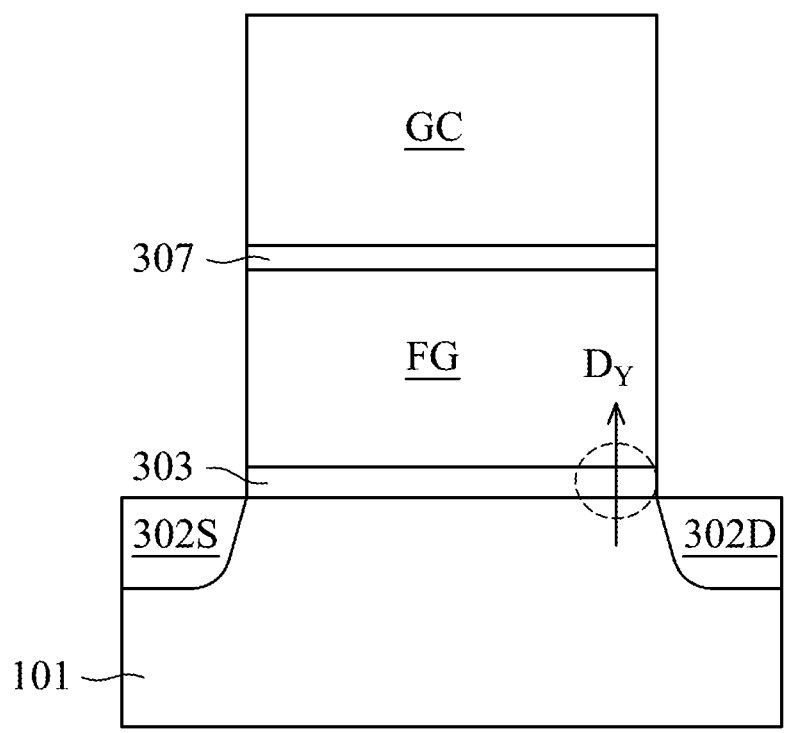
FIG. 4A is a cross-sectional view of a conventional flash memory.
Figure 4B:
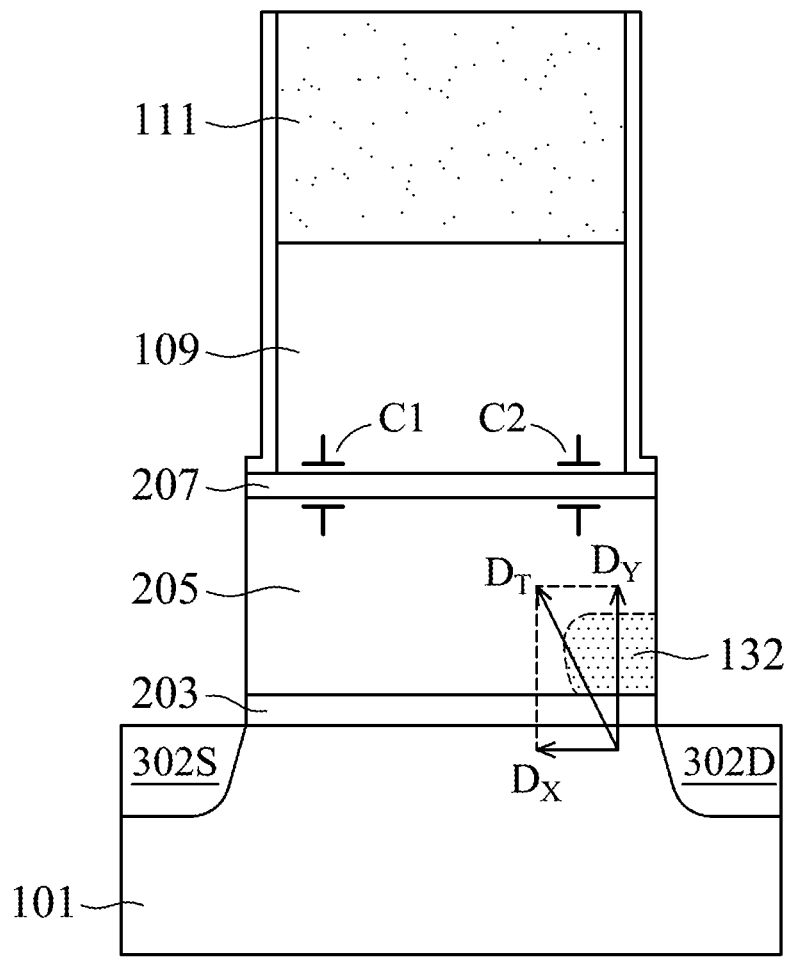
FIG. 4B is a cross-sectional view of a memory structure in accordance with one embodiment of the present invention.

FIG. 4A is a cross-sectional view of a conventional flash memory. FIG. 4B is a cross-sectional view of a memory structure in accordance with one embodiment of the present invention. Similar or identical features/components depicted in FIG. 4B and FIG. 1F are designated with similar or identical reference numbers. Also, the materials and forming method of the features/components in FIG. 4B are identical to those in FIG. 1A-FIG. 1F and have been described above. For the sake of simplicity and clarity, those identical contents in FIG. 4B are not repeated herein.

Referring to FIG. 4A, the conventional flash memory includes a substrate 101 having a source region 302S and a drain region 302D, a tunnel dielectric layer 303, a floating gate layer FG, an inter-gate dielectric layer 307 and a control gate GC. When the write operation of the memory structure is achieved by channel hot electron injection, the hot electrons adjacent to the drain region 302D tunnel through the tunnel dielectric layer 303 along the direction $D_Y$ and into the floating gate layer FG. However, after several cycles of write operation and erase operation are performed, the hot electrons injected along the direction $D_Y$ and passing through the tunnel dielectric layer 303 may cause damage to the injection position of the tunnel dielectric layer 303. Also, the hot electrons tend to accumulate in a region close to the interface between the floating gate layer FG and the tunnel dielectric layer 303 and damage the tunnel dielectric layer 303. Data stored in the floating gate layer FG of a conventional flash memory may be lost due to the damaged tunnel dielectric layer 303.

Referring to FIG. 4B, a doping region 132 is formed in the lower portion of floating gate layer 205 in accordance with some embodiment, so that a P-N junction consisting of the doping region 132 and the floating gate layer 205 with opposite conductivity types is produced. When the write operation of the memory structure is achieved by channel hot electron injection, the forces exerting on the hot electrons adjacent to the drain region 302D include not only the original injection force (along the direction $D_y$) but also a lateral force (along the direction $D_x$) due to the P-N junction produced by the doping region 132. Therefore, as shown in FIG. 4B, the hot electrons tunneling through the tunnel dielectric layer 203 and into the floating gate layer 205 would be subjected to a resultant force along the direction $D_T$ (that is, a direction of the resultant force). Accordingly, the hot electrons can be quickly pushed away from the drain region 302D, thereby increasing speed of write operation and reducing voltage applied to the floating gate layer 205 during a write operation.

According to the aforementioned embodiments, the hot electrons are quickly pushed away from the drain region 302D and injected into floating gate layer 205 obliquely (the hot electrons being subjected to an oblique resultant force), so it is less tendency for the hot electrons accumulating in a region close to the interface between the floating gate layer 205 and the tunnel dielectric layer 203. Also, the voltage applied to the floating gate layer 205 during a write operation can be reduced, so the tunnel dielectric layer 203 would not be easily damaged. After several cycles of write operation and erase operation are performed, the tunnel dielectric layer 203 is not easily damaged and has a good property. Thus, data stored in the floating gate layer 205 of the memory structure in accordance with some embodiments is less likely to be lost.

In addition, the doping region 132 in the lower portion of the floating gate 205 is separated from the inter-gate dielectric layer 207 by a distance, such as the distance d1. That is, the portion above the doping region 132 is still part of the floating gate 205. Accordingly, the capacitance between the floating gate 205 and the control gate 109 is almost the same. For example, as shown in FIG. 4B, the capacitance C1 is approximately equal to the capacitance C2 without affecting the capacitive coupling ratio between the floating gate 205 and the control gate 109. Thus, a stable operating voltage can be maintained during the write operation. Also, the operating voltage needs to be increased due to the change of the capacitance between the gates, but it may cause damage to the inter-gate dielectric layer 207. According to the structural design provided in the embodiments, the memory structure can be operated by a stable operating voltage and the inter-gate dielectric layer 207 is not easily damaged, so that the memory structure has improved reliability.

According to the aforementioned memory structure of some embodiments, a doping region is formed in the lower portion of the floating gate layer. The sidewall of the doping region is exposed at the sidewall of the floating gate, and the doping region is separated from the inter-gate dielectric layer by a distance. In one embodiment, the doping region and the floating gate layer contain different conductivity types of dopants. Also, according to some embodiments of the aforementioned method of manufacturing a memory structure, a memory structure with a self-aligned profile can be obtained. In addition, in order to simplify the drawings, the drawings used in the above embodiments (as shown in FIG. 1A-FIG. 3) only depict three memory structures formed on the substrate for illustration. However, the present disclosure does not limit the actual numbers of the memory structures of a memory device in the application. A memory device may include several memory structures as provided in the above embodiments. Also, the memory structures in accordance with some embodiments can be different types of non-volatile memory structures. The memory structures in accordance with some embodiments can be applied to any memory structure containing a floating gate.

The memory structure as manufactured in accordance with some embodiments includes a doping region in the lower portion of the floating gate layer, and has several advantages, such as accelerating the speed of the write operation, reducing the operating voltage during the write operation, improving the stability of the data storage, etc. Thus, the memory structure in accordance with some embodiments has a relatively stable electrical performance. Consequently, the yield and reliability of the final product can be improved.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory structure, comprising:
a substrate having a source region and a drain region;
a tunnel dielectric layer on the substrate;
a floating gate on the tunnel dielectric layer, wherein the source region and the drain region are formed on two opposite sides of the floating gate;
an inter-gate dielectric layer on the floating gate;
a control gate on the inter-gate dielectric layer, wherein a width of the control gate is less than a width of the floating gate;
a first doping region buried in the floating gate, and a sidewall of the first doping region exposed at a sidewall of the floating gate, wherein the first doping region and the inter-gate dielectric layer are separated from each other; and
a second doping region buried in the floating gate, wherein the second doping region is formed above the first doping region, and a doping concentration of the second doping region is greater than a doping concentration of the floating gate,
wherein the first doping region includes dopants with an opposite conductivity type of dopants in the floating gate.

2. The memory structure as claimed in claim 1, wherein the first doping region contains dopants of a first conductivity type, and the second doping region contains dopants of a second conductivity type that is the opposite of the first conductivity type.

3. The memory structure as claimed in claim 1, wherein the first doping region is disposed adjacent to the drain region.

4. The memory structure as claimed in claim 1, wherein a top edge of the first doping region is separated from a top surface of the floating gate by a first distance, and a ratio of the first distance to a thickness of the floating gate is in a range of ½ to ⅔.

5. The memory structure as claimed in claim 4, wherein the first doping region extends a second distance from the sidewall of the floating gate to an inner portion of the floating gate, and a ratio of the second distance to a width of the floating gate is in a range of ⅕ to ¼.

6. A method of manufacturing a memory structure, comprising:
   providing a substrate having a source region and a drain region;
   forming a tunnel dielectric layer on the substrate;
   forming a floating gate on the tunnel dielectric layer, wherein the source region and the drain region are formed on two opposite sides of the floating gate;
   forming an inter-gate dielectric layer on the floating gate; and
   forming a control gate on the inter-gate dielectric layer, wherein a width of the control gate is less than a width of the floating gate;
   wherein a first doping region is formed in the floating gate, a sidewall of the first doping region is exposed at a sidewall of the floating gate, and the first doping region is separated from the inter-gate dielectric layer; and a second doping region is buried in the floating gate, wherein the second doping region is formed above the first doping region, and a doping concentration of the second doping region is greater than a doping concentration of the floating gate, and wherein the first doping region includes dopants with an opposite conductivity type of dopants in the floating gate.

7. The method of manufacturing the memory structure as claimed in claim 6, further comprising:
   forming a floating gate material layer above the substrate;
   forming an inter-gate dielectric material layer on the floating gate material layer;
   forming the control gate on the inter-gate dielectric material layer;
   forming an insulating layer on the control gate to cover sidewalls of the control gate and parts of the inter-gate dielectric material layer;
   forming spacers on sidewalls of the insulating layer; and
   implanting ions into a lower portion of the floating gate material layer on one side of the spacers to form the first doping region.

8. The method of manufacturing the memory structure as claimed in claim 7, further comprising:
   removing the spacers after the first doping region is formed.

9. The method of manufacturing the memory structure as claimed in claim 8, further comprising:
   etching the inter-gate dielectric material layer and the floating gate material layer by an etching mask formed of the insulating layer to form the inter-gate dielectric layer and the control gate, respectively.

* * * * *